United States Patent [19]
Koike et al.

[11] Patent Number: 5,900,308
[45] Date of Patent: May 4, 1999

[54] MICROSTRIP LINE DIELECTRIC FILTER

[75] Inventors: Kazumasa Koike, Konan; Tatsuya Takemura, Kani, both of Japan

[73] Assignee: NGK Spark Plug Co., Ltd., Nagoya, Japan

[21] Appl. No.: 08/724,472

[22] Filed: Oct. 1, 1996

[30] Foreign Application Priority Data

Oct. 17, 1995 [JP] Japan .................................. 7-294890

[51] Int. Cl.$^6$ ...................................................... B32B 3/00
[52] U.S. Cl. ........................ 428/209; 428/615; 428/672; 428/675
[58] Field of Search ................................. 428/209, 615, 428/672, 675

[56] References Cited

FOREIGN PATENT DOCUMENTS 2 123 615   2/1984   United Kingdom .

OTHER PUBLICATIONS

V. S. Aramati et al., "Thin–Film Microwave Integrated Circuits", IEEE Transactions on Parts, Hybrids and Packaging, vol. 12, No. 4, Dec. (1976), pp. 309–316.

M. W. Hosking, "The Realm of Microwaves", Wireless World, vol. 79, No. 14, Jul. (1973), pp. 31–35.

T. H. Oxley et al., "Microwave Integrated Circuit Techniques", G.E.C. Journal of Science and Technology, vol. 43, No. 1, Jan. (1976), pp. 21–331.

H. Sobol., "Applications of Integrated Circuit Technology to Microwave Frequencies", Proc. of the IEEE, vol. 59, No. 8, Aug. (1971), pp. 1200–1211.

T. C. Edwards., "Foundations for Microstrip Circuit Design", John Wiley and Sons, (1981), pp. 28–29.

*Primary Examiner*—William Krynski
*Assistant Examiner*—Cathy F. Lam
*Attorney, Agent, or Firm*—Foley & Lardner

[57] ABSTRACT

In a microstrip line dielectric filter, a principal layer of a conductor constituting a microstrip line circuit consists of a Cu plating layer and the thickness of the conductor is 10 μm or less. In another embodiment, the thickness of the conductor is determined in relation to a center frequency of a wave transmitted through the filter so as to be within the range defined by a hatched area in the graph of FIG. 6.

4 Claims, 5 Drawing Sheets

MICROSTRIP LINE DIELECTRIC FILTER

BACKGROUND OF THE INVENTION

1. Field of the Invention

The present invention relates to a mircostrip line dielectric filter which is used in a high frequency circuit of a microwave receiver or the like electronic device, for signal-processing purposes.

2. Description of the Related Art

Heretofore, it has been practiced to form a parallel connection type microstrip line filter circuit on a dielectric substrate by utilizing Ag paste as a conductive material, screen-printing the paste on the substrate in such a manner that the printed paste has a desired pattern and baking or firing the printed paste.

In the meantime, a filter produced by the above described method using Ag paste encounters a problem that it requires complicated manufacturing processes, i.e., a drying process and a baking process, and furthermore it has a large electrical resistance since the Ag paste contains glass frit, thus increasing the insertion loss of the filter.

SUMMARY OF THE INVENTION

According to an aspect of the present invention, there is provided a microstrip line dielectric filter which comprises a dielectric substrate, and a microstrip line filter circuit formed on the dielectric substrate so as to have a predetermined pattern, wherein a principal layer of a conductor constituting the microstrip line filter circuit consists of a Cu plating layer and the thickness of the conductor is 10 $\mu$m or less. By this, since the principal layer of the conductor constituting the microstrip line filter circuit consists of a Cu plating layer, its manufacturing method can be simpler and there is not caused any problem, e.g., such a problem inherent in a manufacturing method using Ag paste and a filter circuit manufactured thereby. When the thickness of the conductor exceeds 10 $\mu$m, a crack or cracks are liable to be caused in the substrate due to the internal stress of the conductor at the time of plating.

According to a further aspect of the present invention, there is provided a microstrip line dielectric filter which comprises a dielectric substrate, and a microstrip line filter circuit formed on the dielectric substrate so as to have a predetermined pattern, wherein a principal layer of a conductor constituting the microstrip line filter circuit consists of a Cu plating layer and the thickness of the conductor is determined in relation to a central frequency so as to be within the range defined in a hatched area in a graph of FIG. 6. In this connection, as the thickness of the conductor decreases, the insertion loss of the conductor increases rapidly and variously with relation to a center frequency, thus disabling to attain stable filter characteristics. In the above described hatched area, the insertion loss is relatively small and stable and furthermore the thickness is smaller than 10 $\mu$m. For example, when the center frequency is 10 GHz the thickness of the conductor is in the range from 3 to 10 $\mu$m, and when the center frequency is 4.0 GHz the thickness is in the range from 5 to 10 $\mu$m, i.e., the lower limit of the thickness range within which the insertion loss is held stable, becomes higher as the center frequency becomes lower.

According to a further aspect of the present invention, a Ti or Cr layer may be provided between the dielectric substrate and the Cu plating layer. For example, on the dielectric substrate a Ti or Cr layer of the thickness of 1000 angstroms is formed by sputtering. Then, on the Ti or Cr layer a sputtered Cu layer of the thickness of 2000 angstroms is formed with a view to obtaining intimate contact of a Cu plating layer with the Ti or Cr layer. A Cu plating layer having a predetermined circuit pattern is formed by a photolithography. Further, in case brazing is necessitated, a problem results from the Cu plating layer which is located uppermost or outermost, in that the Cu plating layer is oxidized and deteriorated. In such a case, a Au plating layer having a good corrosion resistance is provided so as to constitute a protective or uppermost layer. In this instance, a two-layer structure consisting of a Cu layer and a Au layer is advantageous in view of the characteristics of the filter. However, since Au and Cu are diffused to each other at the brazing temperature, a Ni layer may be interposed between the Au and Cu layers for preventing diffusion of Au and Cu.

The above structure is effective for solving the above noted problems inherent in the prior art device.

It is accordingly an object of the present invention to provide a novel and improved microstrip line dielectric filter which can be manufactured with ease and at low cost.

It is a further object of the present invention to provide a novel and improved microstrip line dielectric filter of the above described character which can reduce the number of defectives in manufacture and therefore can be produced at increased yield rate.

It is a further object of the present invention to provide a novel and improved microstrip line dielectric filter of the above described character which has improved operation characteristics, e.g., stable and reliable filtering characteristics.

DETAILED DESCRIPTION OF THE PREFERRED EMBODIMENTS

Figure 1A:
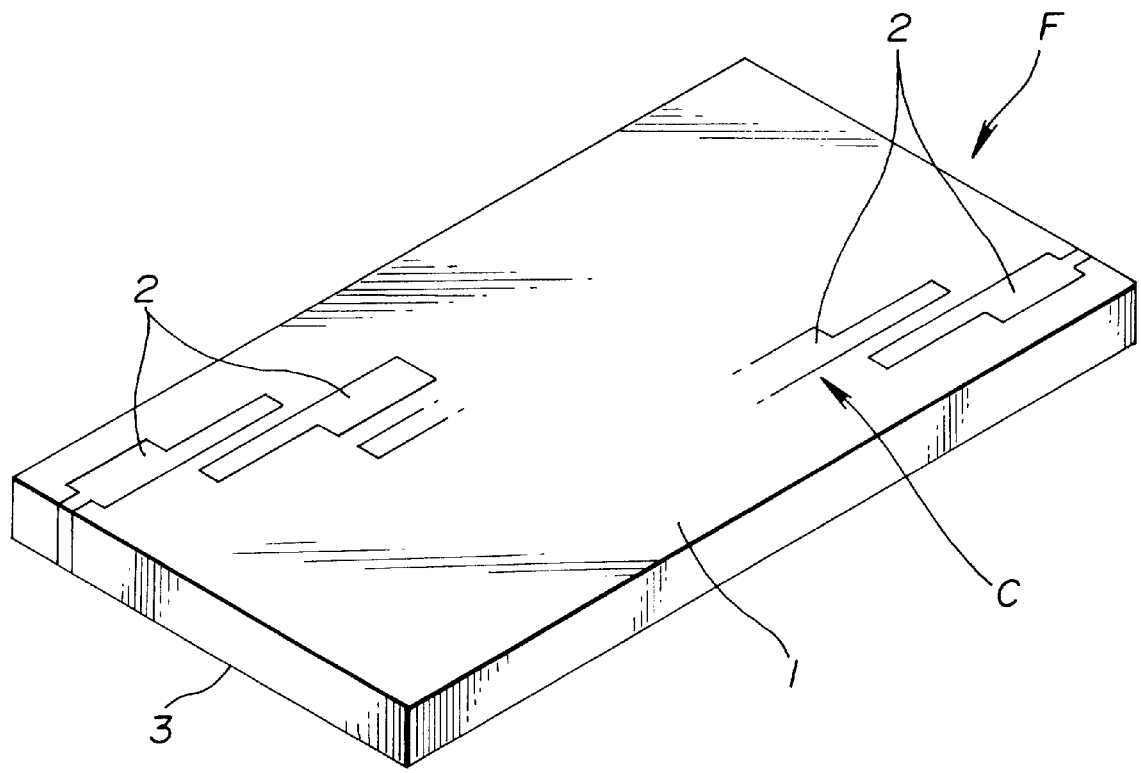
FIG. 1A is a perspective view of a microstrip line dielectric filter according to an embodiment of the present invention.
Figure 1B:
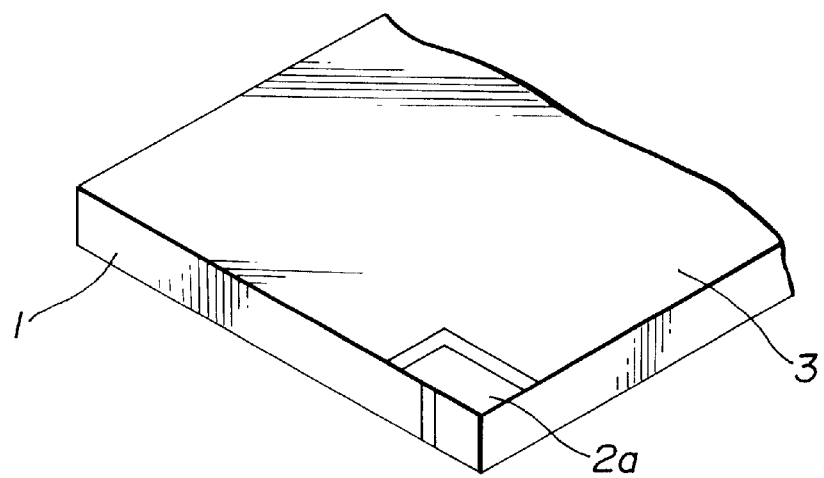
FIG. 1B is a fragmentary perspective view of the microstrip line dielectric filter of FIG. 1A, which is obtained when the filter is observed from the opposite side.

Referring to the drawings, a microstrip line dielectric filter according to an embodiment of the present invention is generally designated by F. As shown in FIG. 1A, the microstrip line dielectric filter F includes a dielectric substrate 1 and a parallel connection type microstrip line filter circuit C consisting of a plurality of parallel, strip-shaped or band-shaped resonant conductors, formed on the dielectric substrate 1. The strip-shaped resonant conductors 2 are magnetically connected to each other by interposing a space between adjacent two of the layers 2. On the lower side surface of the dielectric substrate 1 a shielding conductor 3 is formed. The dielectric substrate 1 is for example of a Ti—Ba—O type or system, i.e., made of a ceramic material such as TiBaO3. Of the plurality of resonant conductors 2, some located adjacent the opposite ends of the substrate 1 have extensions elongating through the respective end faces to the opposite side surface of the substrate 1 and connected to conductor sections 2a, though only one is shown, which are insulated and electrically separated from the adjacent shielding conductor 3 and used as input/output electrodes for surface mounting.

Figure 2:
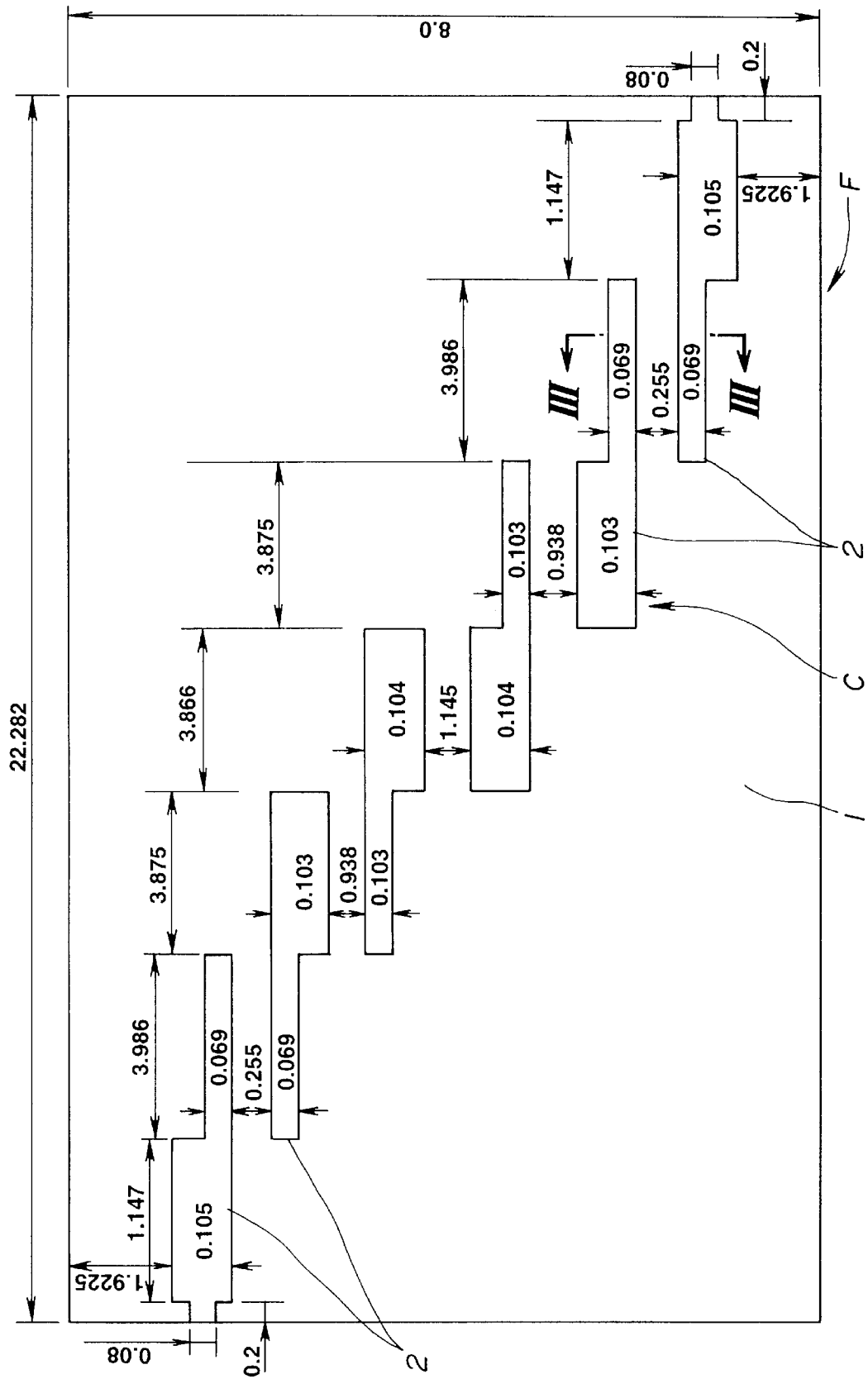
FIG. 2 is an enlarged top plan view of the filter of FIG. 1.

Each of the resonant conductors 2 includes a principal layer 4 which is of a Cu plating layer and the thickness of each conductor 2 is set so as to be 10 μm or less. Further, in order to make the insertion loss smaller and stabler, the thickness of each resonant conductor 2 is set in accordance with a center frequency, e.g., the thickness is set to 5 μm or more in case the center frequency is 4.0 GHz. The Cu plating layer 4 is suited for use in the dielectric filter for the reason that it has a good conductivity and is inexpensive. In FIG. 2 in which the numbers are expressed in the unit of mm, the detailed shapes and arrangement of the resonant conductors 2 are shown.

Figure 3:
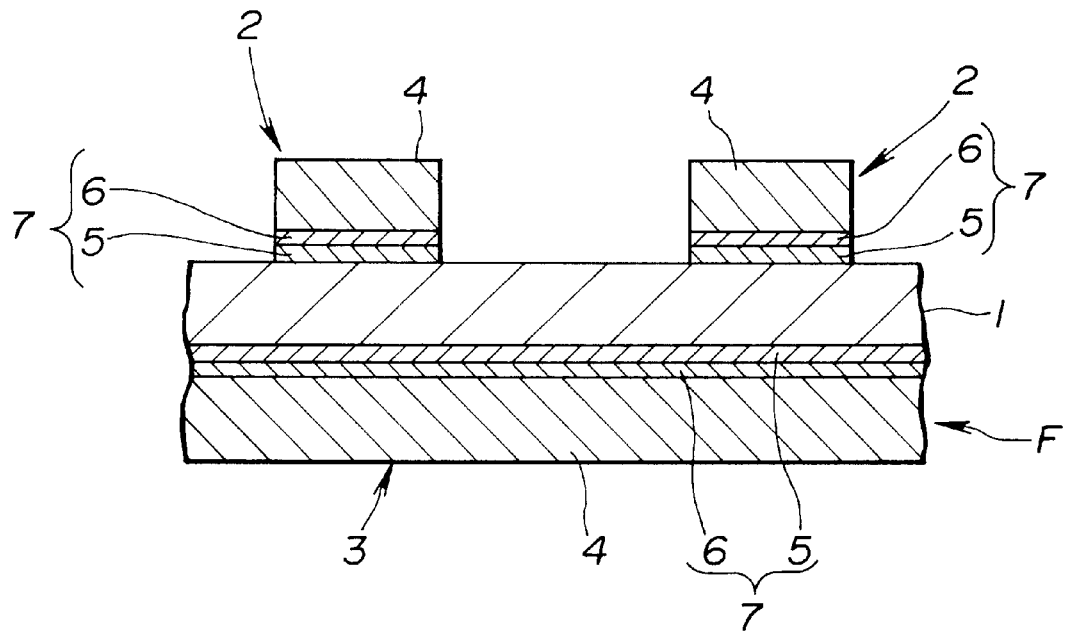
FIG. 3 is an enlarged sectional view taken along the line III—III of the filter of FIG. 2.

Referring to FIG. 3, each resonant conductor 2 includes an undercoat 7 consisting of a Ti layer 5 and a Cu layer 6 which are laid one upon another, and a Cu plating layer 4. The undercoat 7 and the Cu plating layer 4 are placed in sequence upon a dielectric substrate 1.

Figure 4A:
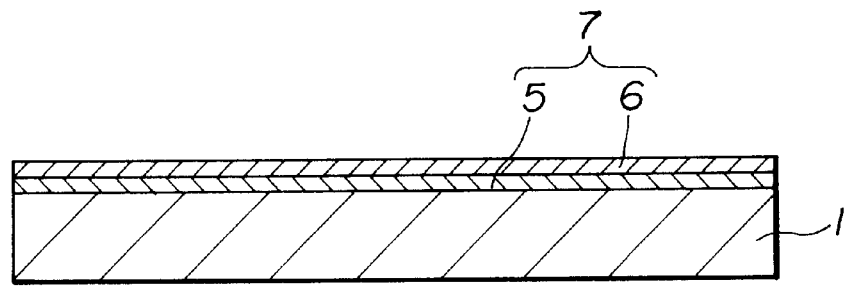
FIGS. 4A to 4C are sectional views for illustrating the manufacturing processes of the filter of FIG. 1.

Each resonant conductor 2 is produced in the following manner. Firstly, as shown in FIG. 4A, the Ti layer 5 which is 1000 angstroms thick and has a good adhesiveness with respect to the dielectric substrate 1, is formed on one entire side surface of the dielectric substrate 1 by sputtering. Then, in order that the Ti layer 5 has a good adhesiveness with respect to the Cu plating layer 4 which is to be formed on the Ti layer 5 in a later process, the Cu layer 6 of the thickness of 2000 angstroms is formed on the Ti layer 5 by sputtering.

Figure 4B:
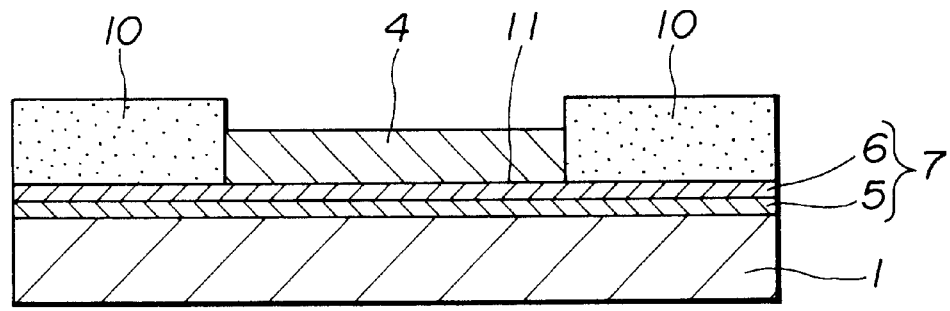

Thereafter, as shown in FIG. 4B, a photoresist layer 10 is applied over the above described undercoat 7 except for a portion 11 over which the Cu plating layer 4 is to be formed. The photoresist layer 10 is formed by photolithography. And, on the portion 11 of the undercoat 7 which is not covered by the photoresist 10, the Cu plating layer 4 of the thickness ranging from 3 to 10 μm is formed by electroplating. In the above manner, the Cu plating layer 4 is formed on the undercoat 7 consisting of the Ti layer 5 and the Cu layer 6, whereby the Cu plating layer 4 can have a good adhesiveness with respect to the dielectric substrate 1 and therefore it becomes possible to increase the mechanical strength of the resonant conductor 2.

Figure 4C:
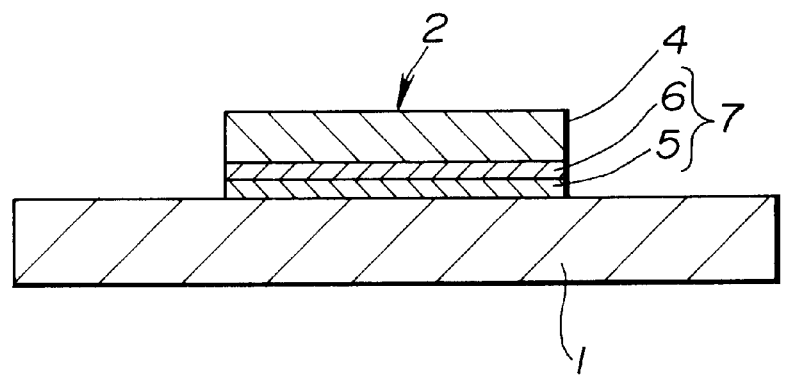

Further, as shown in FIG. 4C, after the photoresist 10 is dissolved and removed, an unnecessary portion of the undercoat 7 which is covered by the photoresist 10, i.e., all of the undercoat 7 except for the portion 11 over which the Cu plating layer 4 is formed, is removed by metal etching.

Thereafter or simultaneously with the above described process, an undercoat 7 consisting of a Ti layer 5 and a Cu layer 6 is formed on a rear side surface of the dielectric substrate 1 by sputtering. Then, a copper plating layer 4 is formed on the undercoat 7 for thereby constituting a shielding conductors 3.

In this connection, the resonant conductor 2 made of Ti and Cu as shown in FIG. 3 was tested for the insertion loss. The test result is shown in Table 1.

TABLE 1

| Thickness of conductor | Insertion loss (dB) Central frequency (GHz) | | | |
|---|---|---|---|---|
| (μm) | 0.1 | 1.0 | 4.0 | 10 |
| 1 | 6.7 | 4.6 | 3.2 | 2.0 |
| 3 | 6.3 | 4.1 | 2.9 | 1.5 |
| 5 | 5.9 | 3.8 | 2.5 | 1.5 |

TABLE 1-continued

| Thickness of conductor | Insertion loss (dB) Central frequency (GHz) | | | |
|---|---|---|---|---|
| (μm) | 0.1 | 1.0 | 4.0 | 10 |
| 7 | 5.4 | 3.5 | 2.5 | 1.5 |
| 10 | 5.0 | 3.5 | 2.5 | 1.5 |
| 13 | 4.6 | 3.5 | 2.5 | 1.5 |
| 15 | 4.6 | 3.5 | 2.5 | 1.5 |

An example of filter used in the test was of the type shown in FIG. 2. In the example, the Ti layer 5 is 1000 angstroms thick and the Cu layer 6 is 2000 angstroms thick. As seen from FIG. 2, the number of sections (i.e., the number of intervals provided between the conductors) is five. Further, it was set that the fractional band width was 5% and the voltage standing wave ratio (VSWR) was 1.1. Further, the dielectric substrate 1 was of the Ti—Ba—O type and 0.635 mm thick. Further, the test was conducted under the condition that $\epsilon r=36$ and Q-value=8000 (i.e., measured frequency was 8 GHz).

From this table, it will be seen that the insertion loss varies in accordance with a variation of the center frequency of a wave transmitted through the filter and the thickness of the conductor and becomes smaller and stabler when the thickness of the conductor is 3 μm or more with the center frequency of 10 GHz, 5 μm or more with the center frequency of 4.0 GHz, 7 μm or more with the center frequency of 1.0 GHz, and 13 μm or more thick with the center frequency of 0.1 GHz, respectively. That is, it will be seen that the insertion loss becomes larger as the thickness of the conductor decreases, and the lower limit of the thickness range of the conductor within which the insertion loss is held stable, becomes larger as the center frequency becomes lower.

On the other hand, when the thickness of the resonant conductor 2 is so large, a crack or cracks are liable to be caused in the substrate 1 by the influence of the internal stress of the plating. So, the examples were prepared and tested for the relation between the thickness of the resonant conductor 2 and the crack occurrence rate. The test result was shown in Table 2.

As seen from Table 2, the crack occurrence rate becomes so high when the thickness of the conductor 2 exceeds 10 μm. Accordingly, the upper limit of the thickness range of the resonant conductor 2 is limited to 10 μm. On consideration of the stable range of the insertion loss in relation to the central frequency and the crack occurrence rate, a desired thickness range of a resonant conductor is represented by the hatched line portion or area in the graph of FIG. 6.

TABLE 2

| Thickness of conductor (μm) | Crack occurrence rate (A/B*) |
|---|---|
| 1 | 0/20 |
| 3 | 0/20 |
| 7 | 0/20 |
| 10 | 3/20 |
| 12 | 11/20 |
| 14 | 20/20 |

*A is the number of examples where a crack or cracks were caused, and B is the total number of examples subjected to the test.

In the meantime, in place of the Ti layer 5, a Cr layer of the thickness of 250 angstroms can be used and formed by sputtering. In this instance, a result similar to that shown in Tables 1 and 2 was obtained.

Figure 5:
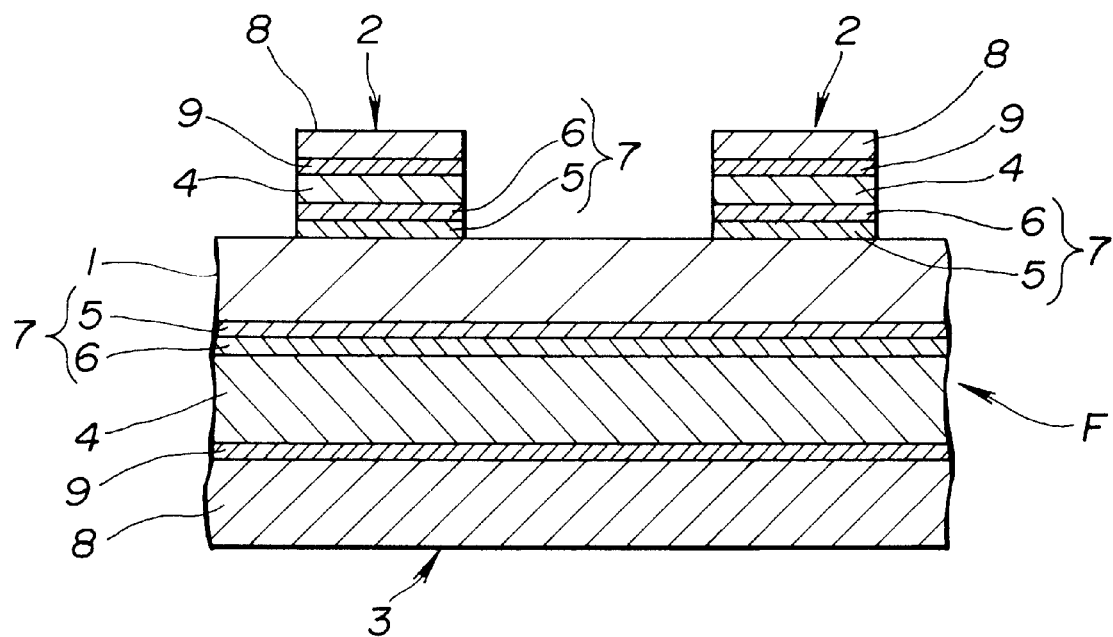
FIG. 5 is a sectional view similar to FIG. 3 but shows another embodiment of the present invention.

On the other hand, in case a lead wire or the like is brazed to the resonant conductor 2, the Cu plating layer 4 is oxidized to cause a problem of deterioration of the resonant conductor 2 since the Cu plating layer 4 is positioned uppermost or outermost. Thus, as shown in FIG. 5, a Au plating layer 8 having a good corrosion resistance is provided as a protective layer (i.e., an uppermost or outermost layer). In this instance, while two-layer structure consisting of a Cu layer and a Au layer is advantageous to the characteristics of the resonant conductor 2, the Cu and Au are diffused to each other at the brazing temperature. So, in order to prevent such diffusion, a Ni plating layer 9 is provided between the Cu plating layer 4 and the Au plating layer 8. With such a structure in which the gold plating layer 8 forms the uppermost or outermost surface of the conductor 2, there is attained an additional advantage that in case of the above described metal etching the Cu plating layer 4 is protected by the Au plating layer 8.

Also in such a structure, on the rear surface of the above described dielectric substrate 1 there are formed, similarly to the front surface, a Ti layer 5, a Cu layer 6 and a Cu plating layer 4 in sequence, and further a Ni plating layer 9 and a Au plating layer 8 are provided thereover, whereby to constitute a shielding conductor 3.

In this connection, the thickness of the Cu plating layer 4 which is of a lower layer of the shielding conductor 3, is set to ½ of that of the above described Ti—Cu layer structure in FIG. 3 in order to make the thickness of the resonant conductor 2 substantially constant. In this connection, the thickness of the Au plating layer 8 is defined by the following theoretical expression.

$$\delta = 2(/\omega\mu\sigma)^{1/2}$$

where $\delta$ is thickness of layer, $\omega$ is frequency, $\mu$ is magnetic permeability, and $\sigma$ is conductivity.

$$\delta Au/\delta Cu = (4.17 \times 10^7/3.7 \times 10^7)^{1/2} = 1.06$$

From the above, it will be seen that the thickness of the Au plating layer 8 needs be 1.06 times or more thicker than that of the Cu plating layer 4. On the other hand, it is necessitated to make the Au plating layer 8 and the Cu plating layer 4 nearly equal in thickness in order to keep them balanced. That is, if the thickness of the Au plating layer 8 is fairly thicker as compared with that of the Cu plating layer 4 though it is necessitated to be 1.06 times thicker, it is recognized that the characteristics of the resonant conductor is deteriorated. Thus, on consideration of the balanced thickness and cost, it is suitable to determine that the Au plating layer 8 is 1.06 to 1.2 times thicker than that of the Cu plating layer 4.

Figure 6:
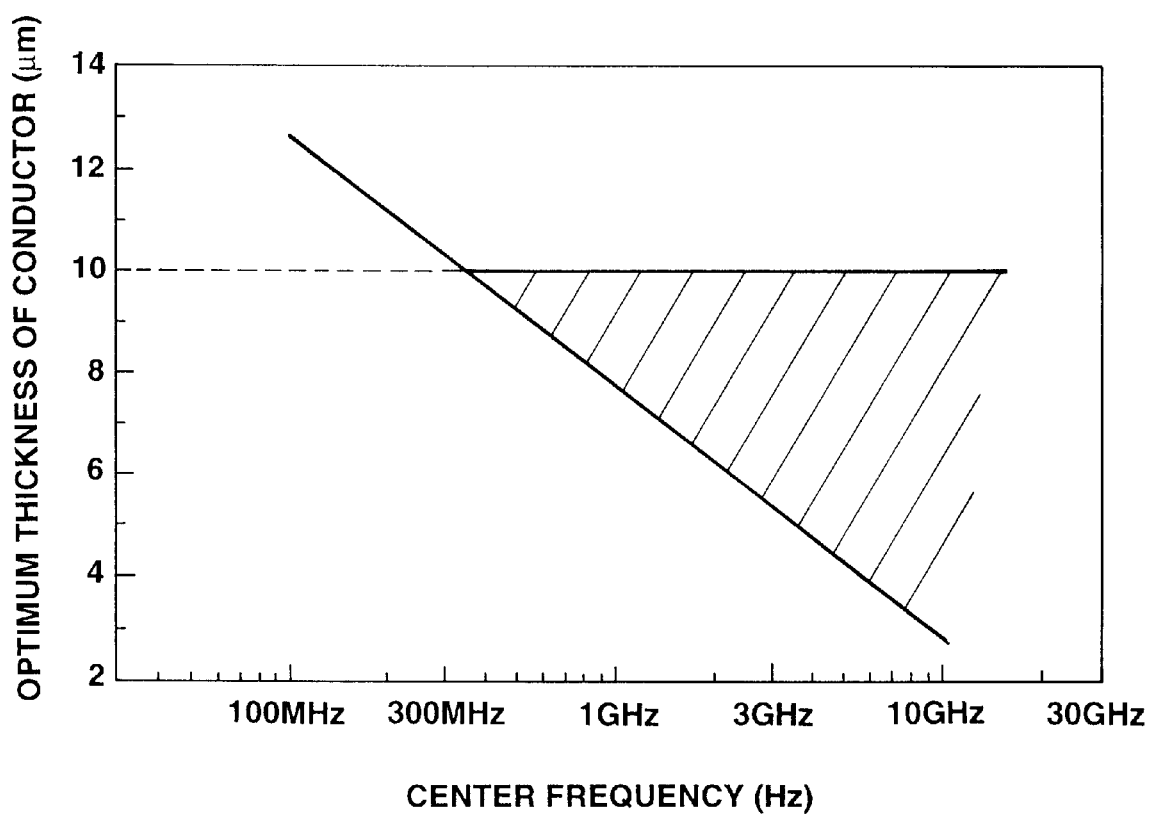
FIG. 6 is a graph of an optimum thickness of a conductor of a filter in relation to a center frequency of a wave transmitted through the filter.

By this structure, the relation between the insertion loss and the thickness of the resonant conductor is almost similar to that of the Ti-Cu structure shown in FIG. 3 since Au and Cu does not largely differ in conductivity, so the optimum or desired thickness of the resonant conductor in relation to the central frequency is limited to the value included in the hatched portion or area in the graph of FIG. 6.

From the foregoing, it will be understood that according to the present invention the principal layer of the conductor constituting a circuit of a microstrip line dielectric filter consists of a Cu plating layer and the thickness of the conductor is set to 10 $\mu$m or less, so the manufacturing of the circuit does not require so much processes as in the case of using Ag paste or the like and therefore its manufacturing method can be simpler, and the circuit can be produced at an improved yield rate.

It will be further understood that according to the present invention the thickness of the conductor is determined in relation to a center frequency of a wave transmitted through the filter so as to be within the range defined by the hatched area in the graph of FIG. 6, whereby the crack occurrence rate and the insertion loss can be made smaller and nearly constant, and stable filter characteristics can be attained.

Further, in case a Ti or Cr layer is interposed between a dielectric substrate and a Cu plating layer, the adhesiveness between the dielectric substrate and the Cu plating layer is improved and the mechanical strength of the conductor can be increased.

In case a Au plating layer is further formed on a Cu plating layer, a difficulty in brazing can be eliminated since the Au plating layer has a good corrosion resistance, thus making it possible to obtain desirable effects, e.g., making it possible to connect lead wires to a circuit of a microstrip line filter with efficiency and assuredness. In this instance, it is desirable to provide the Ni plating layer 9 between the Cu plating layer 4 and the Au plating layer 8 with a view to preventing Au and Cu from being diffused to each other at the brazing temperature.

What is claimed is:

1. A microstrip line dielectric filter comprising:
    a dielectric substrate; and
    a plurality of conductors formed on said dielectric substrate to constitute a microstrip line circuit of a predetermined pattern;
    each of said conductors including an undercoat formed on said substrate and a Cu plating layer formed on said undercoat;
    wherein the thickness of each of said conductors ranges from a value which is determined in relation to a central frequency and inversely proportional to said central frequency to 10 $\mu$m; and
    wherein each of said conductors further includes a Au plating layer formed on said Cu plating layer, wherein said Au plating is 1.06 to 1.2 times thicker than said Cu plating layer.

2. A microstrip line dielectric filter according to claim 1, wherein said undercoat consists of a sputtered Ti layer formed on said substrate and a sputtered Cu layer interposed between said Cu plating layer and said sputtered Ti layer.

3. A microstrip line dielectric filter according to claim 1, wherein said undercoat consists of a sputtered Cr layer formed on said substrate and a sputtered Cu layer interposed between said Cu plating layer and said sputtered Cr layer.

4. A microstrip line dielectric filter according to claim 1, wherein each of said conductors further includes a Ni plating layer between said Cu plating layer and said Au plating layer.

* * * * *